(12) United States Patent
Roberts et al.

(10) Patent No.: US 7,358,493 B2
(45) Date of Patent: Apr. 15, 2008

(54) METHOD AND APPARATUS FOR AUTOMATED BEAM OPTIMIZATION IN A SCANNING ELECTRON MICROSCOPE

(75) Inventors: William Roberts, Mechanicsville, VA (US); Christopher Gould, Quinton, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 350 days.

(21) Appl. No.: 11/147,260

(22) Filed: Jun. 8, 2005

(65) Prior Publication Data
US 2006/0278826 A1 Dec. 14, 2006

(51) Int. Cl.
G01N 23/00 (2006.01)
G21K 7/00 (2006.01)

(52) U.S. Cl. .......... 250/310; 250/311; 250/492.1; 250/492.2; 250/398; 356/401; 430/30

(58) Field of Classification Search ........ 250/310, 250/311, 492.1, 492.2, 398; 356/401; 430/30
See application file for complete search history.

(56) References Cited

U.S. PATENT DOCUMENTS

| | | | |
|---|---|---|---|
| 4,451,737 A | 5/1984 | Isakozawa | |
| 4,851,674 A | 7/1989 | Kobayashi | |
| 4,907,287 A | 3/1990 | Homma et al. | |
| 5,144,129 A | 9/1992 | Kobayashi et al. | |
| 5,313,062 A | 5/1994 | Yamada | |
| 5,659,174 A | 8/1997 | Kaneoka et al. | |
| 6,384,408 B1 | 5/2002 | Yee et al. | |
| 6,437,330 B1 | 8/2002 | Sugiyama | |
| 6,825,480 B1 | 11/2004 | Watanabe et al. | |
| 6,875,983 B2 | 4/2005 | Nakazawa et al. | |
| 2002/0008200 A1 | 1/2002 | Kuwahara | |
| 2003/0006372 A1 | 1/2003 | Morita et al. | |
| 2003/0178576 A1 | 9/2003 | Pan et al. | |
| 2003/0201392 A1 | 10/2003 | Duval et al. | |
| 2004/0075051 A1 | 4/2004 | Sullivan et al. | |
| 2004/0173748 A1 | 9/2004 | Dirksen et al. | |
| 2005/0072920 A1 | 4/2005 | Inada | |

OTHER PUBLICATIONS

"Statistical models for estimating the measurement of pitch in metrology instruments", Zhang, N.F., Postek, M.T., Larrabee, R.D., Metrologia1997, vol. 34, pp. 467-477.*

* cited by examiner

Primary Examiner—Jack I. Berman
Assistant Examiner—Meenakshi S Sahu
(74) Attorney, Agent, or Firm—Edell, Shapiro & Finnan, LLC

(57) ABSTRACT

A method and apparatus according to the present invention define optimal conditions for a scanning electron microscope (SEM), preferably a critical dimension scanning electron microscope (CDSEM). The present invention provides an image quality monitor that utilizes image processing and optimization to maintain image quality at a desired level. Images from a stage sample are automatically collected, while microscope operational parameters are determined based on image processing to enable continuous monitoring of microscope operation. The technique may be performed manually or automatically and generates set points for beam conditioning elements to produce or maintain ideal beam conditions to enhance image quality. The present invention generates data indicating optimized values for each beam alignment parameter. The optimized values are applied to the internal microscope values to optimize the beam. The results may be provided to the technician, a data storage system or directly to the microscope control mechanisms.

28 Claims, 12 Drawing Sheets

METHOD AND APPARATUS FOR AUTOMATED BEAM OPTIMIZATION IN A SCANNING ELECTRON MICROSCOPE

BACKGROUND OF THE INVENTION

1. Technical Field

The present invention pertains to beam control within electron microscopes. In particular, the present invention pertains to determining optimal beam parameters for a scanning electron microscope and automatically applying the optimal beam parameters to adjust the microscope beam for enhanced operation.

2. Discussion of Related Art

A scanning electron microscope (SEM) may be utilized to measure a dimension of a pattern in a sample, such as a semi-conductor device. Generally, the microscope directs electrons in the form of a beam to converge at a point on a microscope stage containing the sample or semi-conductor device. The electron beam is scanned across the stage, where electronic control mechanisms are typically housed within a column of the microscope and utilized to steer and focus the beam onto the sample. These mechanisms include various lenses and a cylindrical coil with additional exterior coils to produce electric fields to steer the beam along one or more axes toward the sample. The parameters of these mechanisms are critical to proper microscope operation for an application.

When the sample on the stage is irradiated, a physio-electrical reaction occurs and electrons are reflected and/or discharged from the sample surface. The microscope collects and detects the electrons from the sample surface to form an electronic intensity profile of that surface. Since various portions of the semi-conductor device produce different electron spectra (e.g., different material layers, different topography (e.g., flat areas, edges, etc.), etc.), the profile basically provides a view of the sample surface.

The scanning of the beam across a desired sample portion and subsequent collection of the reflected and/or discharged electrons enables measurement of the sample portion size. This feature is commonly known as a critical dimension (CD) and may be of any feature or characteristic of the sample. Electron microscopes performing these types of measurements are generally referred to as critical dimension scanning electron microscopes (CDSEM). Since uniformity and accuracy with respect to critical dimension measurement is crucial for device yield in semi-conductor processing, the scanning electron microscope is employed to provide an accurate critical dimension measurement. However, the quality of the beam image may degrade due to various causes (e.g., astigmatism of the beam system, reduced resolution attributed to defocusing, etc.), thereby rendering measurements unsatisfactory. Thus, set-up and maintenance of the electronic and physical hardware of the microscope for beam delivery and subsequent electron collection are crucial. Further, chamber conditions and substrate materials are considered since these have a significant effect on the optimization of the beam delivery parameters for each substrate layer.

Accordingly, frequent changes are required for the set points and alignment of the microscope beam. This process is generally performed manually. Specifically, a vendor typically provides an artifact on the microscope stage. The microscope scans a particular feature of the artifact (e.g., prior to processing of the desired semi-conductor device) and a technician subsequently adjusts set points of beam focusing and stigmation parameters (e.g., via adjustment of potentiometers). This is typically accomplished by altering a control current of an objective lens and control current of the above-described coils while observing the beam image. The technician is basically aligning the beam with respect to a plurality of axes to optimize the visual acuity of the sample on the stage. The visual acuity generally refers to the condition providing an optimal beam conditioning (e.g., the best beam focus, the least effect of stigmation, etc.) for the particular sample.

The related art suffers from several disadvantages. In particular, the set points and parameters are determined based on a subjective viewing of image quality by the technician. This tends to provide varying criteria for image quality and produce variations in the determined set points and parameters, thereby producing varying results for feature measurements. Further, microscope control settings determined from poor microscope images may result in unpredictable actions. Moreover, the microscope is typically monitored and/or calibrated periodically. Thus, the microscope may be utilized with marginal or inadequate settings for a particular sample and provide inaccurate measurement results. In addition, the manual process typically requires several iterations to attain desired settings and may be repeated several times in a short time interval, thereby significantly increasing the time for tasks and semi-conductor processing.

SUMMARY OF THE INVENTION

According to the present invention, a method and apparatus quantifiably define optimal conditions for a scanning electron microscope (SEM), preferably a critical dimension scanning electron microscope (CDSEM). The present invention basically provides an image quality monitor for the microscope and utilizes image processing and optimization to monitor and maintain image quality at a desired level. Images from a stage sample are automatically collected, while microscope operational parameters are determined based on image processing to enable continuous monitoring of microscope operation. The present invention technique may be performed manually or automatically within or external of the microscope controller and generates set points for beam conditioning elements to produce or maintain ideal beam conditions to enhance image quality. The present invention generates data indicating optimized values for each beam alignment parameter. The optimized values are applied to the internal microscope values to optimize the beam. The results may be provided to the technician, a data storage system or directly to the microscope control mechanisms.

In particular, data is collected across a range of beam optimization tuning parameter values (e.g., focus, stigmation or other beam parameters may be varied with analysis of reflected and/or discharged electron density images). A data characteristic is determined for output variation based on input variation. For example, pixel image intensity counts have separable responses for beam focus control set points, where the histogram of the pixel image intensities have predictable separation in histogram regions associated with image edges for a current sample. The output characteristic of unique data values are modeled to produce a model describing the beam conditioning and optimal set points for each control function. The models are utilized to determine optimal beam parameters that are applied to the microscope.

The present invention provides several advantages. For example, the present invention automatically aligns the microscope beam and employs a self-alignment control.

Quantifiable beam parameter set points are determined for ideal focus, stigmation and a stigmation control. The present invention enhances product performance and yield due to improved in-line and end-of-line critical dimension measurement and control, and improves feedback and feed-forward data control via high integrity data collection. In addition, the present invention provides rapid and inexpensive beam alignments without need for human intervention.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1A:
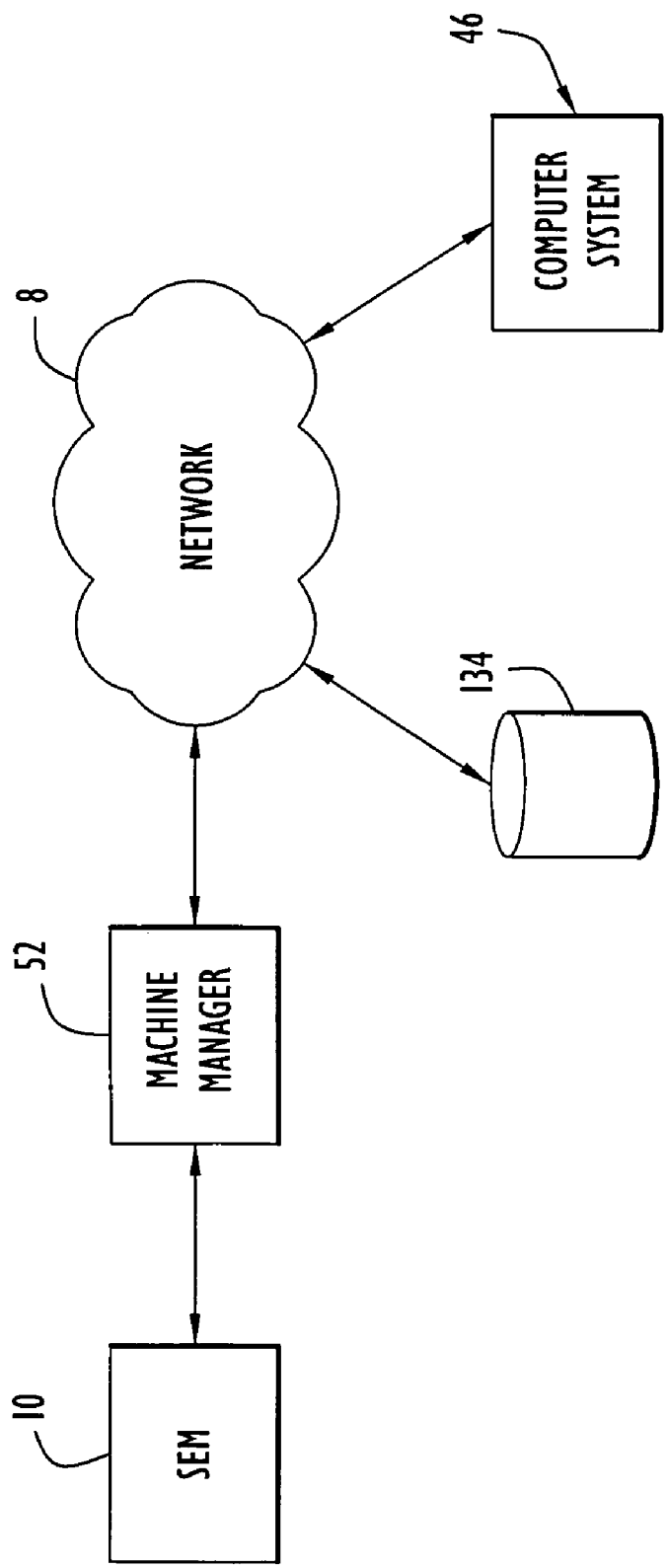
FIG. 1A is a diagrammatic illustration of an exemplary arrangement of a scanning electron microscope within a semi-conductor processing facility.

The present invention is directed toward automatic monitoring of electron scanning microscopes (SEM), preferably critical dimension scanning electron microscopes (CD-SEM), and automatic adjustment of microscope beam parameters to optimal values based on quantifiable criteria to enhance image quality. An exemplary arrangement for a scanning electron microscope according to the present invention within a semi-conductor processing facility is illustrated in FIG. 1A. Specifically, a scanning electron microscope 10 is coupled to a machine manager 52. The machine manager is preferably implemented as a server computer system coupled to a network 8 and may be implemented by any conventional or other processing system (e.g., personal computer, etc.) with appropriate software. The machine manager processes requests for and monitors operation of microscope 10, and may accommodate any quantity of microscopes within the facility. The network is preferably implemented as a local area network (LAN), but may be any type of network (e.g., WAN, Internet, etc.) or other communications medium. The microscope produces various images that are stored in an image store 134 in communication with the microscope via network 8. A computer system 46, preferably a personal computer, is in communication with machine manager 52, microscope 10 and image store 134, via network 8, to monitor, analyze and adjust microscope beam parameters according to the present invention as described below. The computer system may be implemented by any conventional personal or other suitable computer system or workstation preferably equipped with a display or monitor, a base (e.g., including the processor, memories and/or internal or external communications devices (e.g., modem, network cards, etc.)), a keyboard and a mouse or other input device. The computer system includes software (e.g., operating system, microscope monitoring software, etc.) and appropriate components (e.g., processor, disk storage or hard drive, etc.) including sufficient processing and storage capabilities to effectively execute that software. The computer system may include any suitable platform (e.g., Unix, Windows, Macintosh, etc.)

The facility may include similar arrangements for any quantity of other microscopes within the facility, where the arrangement may include any quantity of components (e.g., microscopes, machine managers, computer systems, networks, image stores, etc.). The various components (e.g., microscope, machine manager, computer system, image store, etc.) may be in communication with or coupled to each other in any suitable fashion (e.g., wired, wireless, over a network (e.g., WAN, LAN, Internet, etc.), directly or indirectly coupled, local or remote from each other, etc.) via any communications medium and may utilize any suitable communication protocol or standard.

Figure 1B:
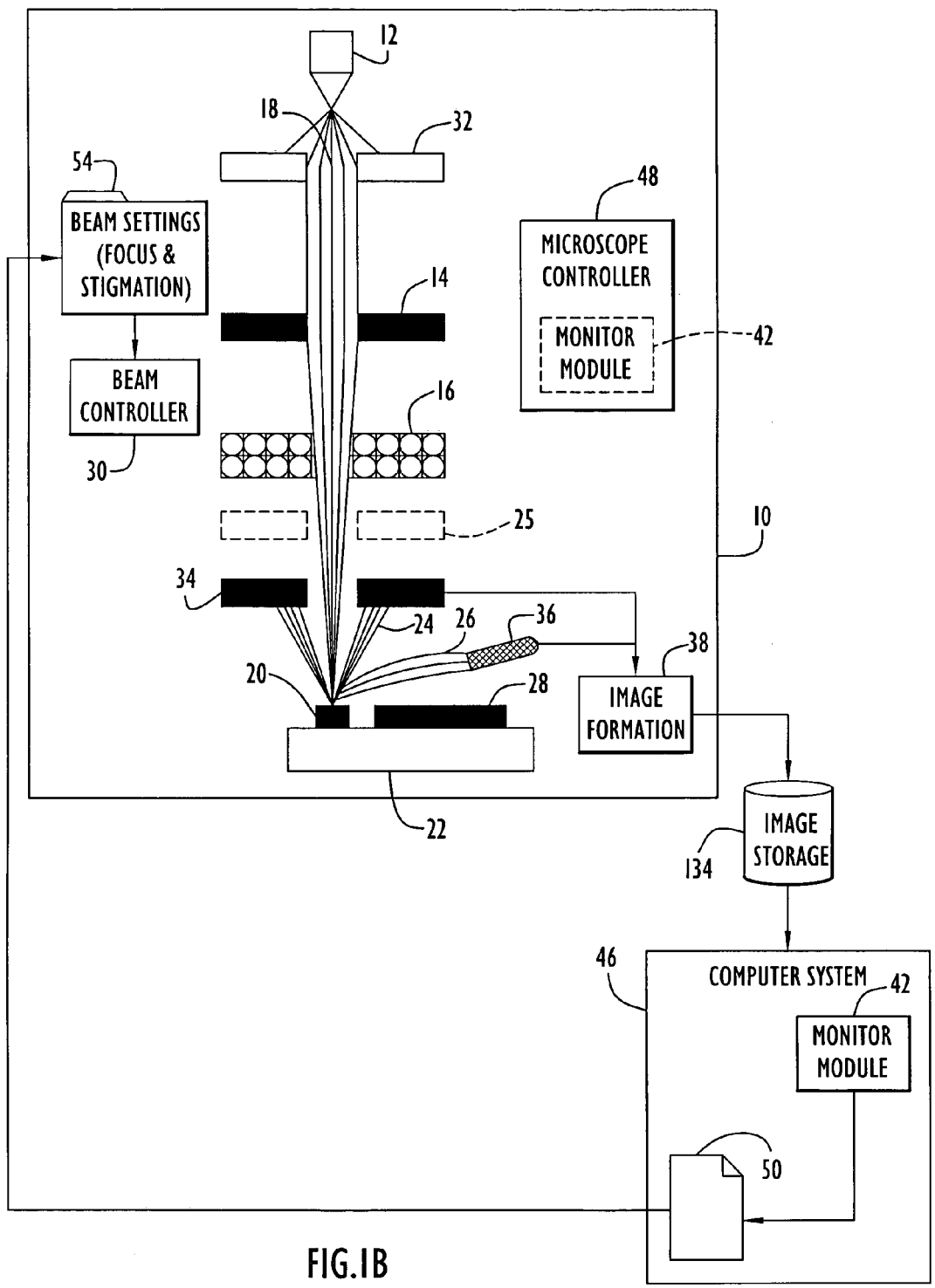
FIG. 1B is a block diagram of an exemplary scanning electron microscope employing monitoring and optimized beam parameter adjustment according to the present invention.

An exemplary scanning electron microscope or tool employing the present invention is illustrated in FIG. 1B. Specifically, electron microscope 10 includes an electron gun 12, a dispersion device 32, a magnetic lens 14, stigmator coils 16, an optional condenser lens 25, a reflected electron detector 34, a secondary electron detector 36 and a sample stage 22. The microscope further includes a beam controller 30 to control the various microscope components and collection of information from a beam scan for processing as described below.

A beam 18 is emitted from electron gun 12 and is dispersed or widened by dispersion device 32 (e.g., an anode). The beam is accelerated by magnetic lens 14 toward stigmator coils 16 to control astigmatism or symmetry of the electron beam. Optional condenser lens 25 may be utilized to focus the beam onto sample stage 22. The various beam controlling components are controlled by beam controller 30. The beam controller accesses a file or other storage device 54 containing various beam control parameters and settings to control the beam. The beam controller may be implemented by any conventional or other controller, microprocessor or circuitry.

The sample stage is typically movable in a plurality of axes (e.g., X, Y and Z axes), while the electron beam may be scanned in two-dimensions across the sample stage. The sample stage typically includes a product specimen 28 (e.g., semi-conductor device) and a sample 20 utilized for beam parameter adjustment as described below. The sample maybe in any desired form and may include any features optimal for a particular input control parameter.

Scanning of sample 20 with beam 18 generates return particles 24, 26 (e.g., particles characteristic of sample 20) from the sample surface. Particles 24 represent electrons reflected from the sample surface, while particles 26 represent electrons discharged from the sample surface due to collisions with electron beam 18. The reflected and discharged particles are respectively detected by reflected and secondary electron detectors 34, 36. The detected signals are processed to form an image by image formation unit 38, where the image is stored in image store 134. The microscope components described above (e.g., electron gun, lenses, dispersion device, stigmator coils, stage, etc.) are preferably implemented by conventional components and may be arranged in any suitable fashion.

A microscope controller 48 processes and applies beam parameters to control microscope operation and enables the microscope to operate and provide various beam conditions. The microscope controller may further enable communications with external devices (e.g., image store, machine manager, computer system, etc.) or networks. The microscope controller may be implemented by any conventional or other microprocessor, controller or processing system. Basically, the microscope controller in combination with the beam controller control microscope operation based on various beam or other parameters. The parameters may include: a focal length of the lenses (e.g., control of focusing by adjusting currents flowing through lens coils), astigmatism of the electron beam (e.g., astigmatism correction by adjusting currents flowing through the stigmator coils), a deviation of the axis of the electron beam from a reference axis, brightness and contrast of the image (e.g., by adjusting bias and gain of detector units), acceleration voltages, scan rates (e.g., by adjusting currents flowing in lens and/or stigmator coils), an amount of movement of a field of view of the sample (e.g., selecting the field of view by adjusting currents flowing through the lens and/or stigmator coils or moving the sample stage), an emission current, starting/stopping of scanning, starting to create an image, magnification and corresponding voltage and measuring of a length between arbitrary positions on the image.

In order to ensure proper operation, frequent changes are required for the set points and alignment of the microscope beam as described above. This process is generally performed manually, where the microscope scans a particular feature of a sample and a technician subsequently adjusts set points of beam focusing and stigmation parameters (e.g., via adjustment of potentiometers) while observing the beam image as described above. However, the set points and parameters are determined based on a subjective viewing of image quality by the technician. This tends to provide varying criteria for image quality and produce variations in the determined set points and parameters, thereby producing varying results for imaging and critical dimension measurements.

Accordingly, the present invention utilizes quantifiable criteria to evaluate image quality and produces optimal beam parameters for the scanning electron microscope based on image processing to enhance imaging. The present invention basically serves as a monitoring system for the microscope to evaluate images and adjust beam parameters to optimal settings, and is preferably implemented as a software module (e.g., monitor module or unit 42) residing on computer system 46 that calculates and communicates the determined beam parameters to microscope 10. Alternatively, the monitor module may reside within microscope controller 48. The present invention may be implemented by any quantity and/or combination of software and/or hardware modules or units.

The microscope monitoring software is preferably implemented in a MATLAB computing language (e.g., a matrix libraries software package with image processing capabilities), available from The MathWorks, Inc. of Natick, Mass. The software may be compiled with a MATLAB compiler and utilized as an executable module on various processing systems (e.g., even without the originating software application present). However, the microscope monitoring software may be implemented in any desired computing language suitable for the microscope controller or computer system. The computer system or microscope controller, under software control, basically implements the present invention for monitoring and determining optimal microscope beam parameters as described below. The computer system may operate as a stand-alone tool to provide optimal beam parameters to a technician for manual application to the microscope or automatically transmit the optimal beam parameters to the microscope for automatic adjustment. Further, the software of the present invention may be available on a recordable medium (e.g., magnetic, optical, floppy, DVD, CD, etc.) or in the form of a carrier wave or signal for downloading from a source via a communication medium (e.g., bulletin board, network, WAN, LAN, Intranet, Internet, etc.).

Figure 2A:
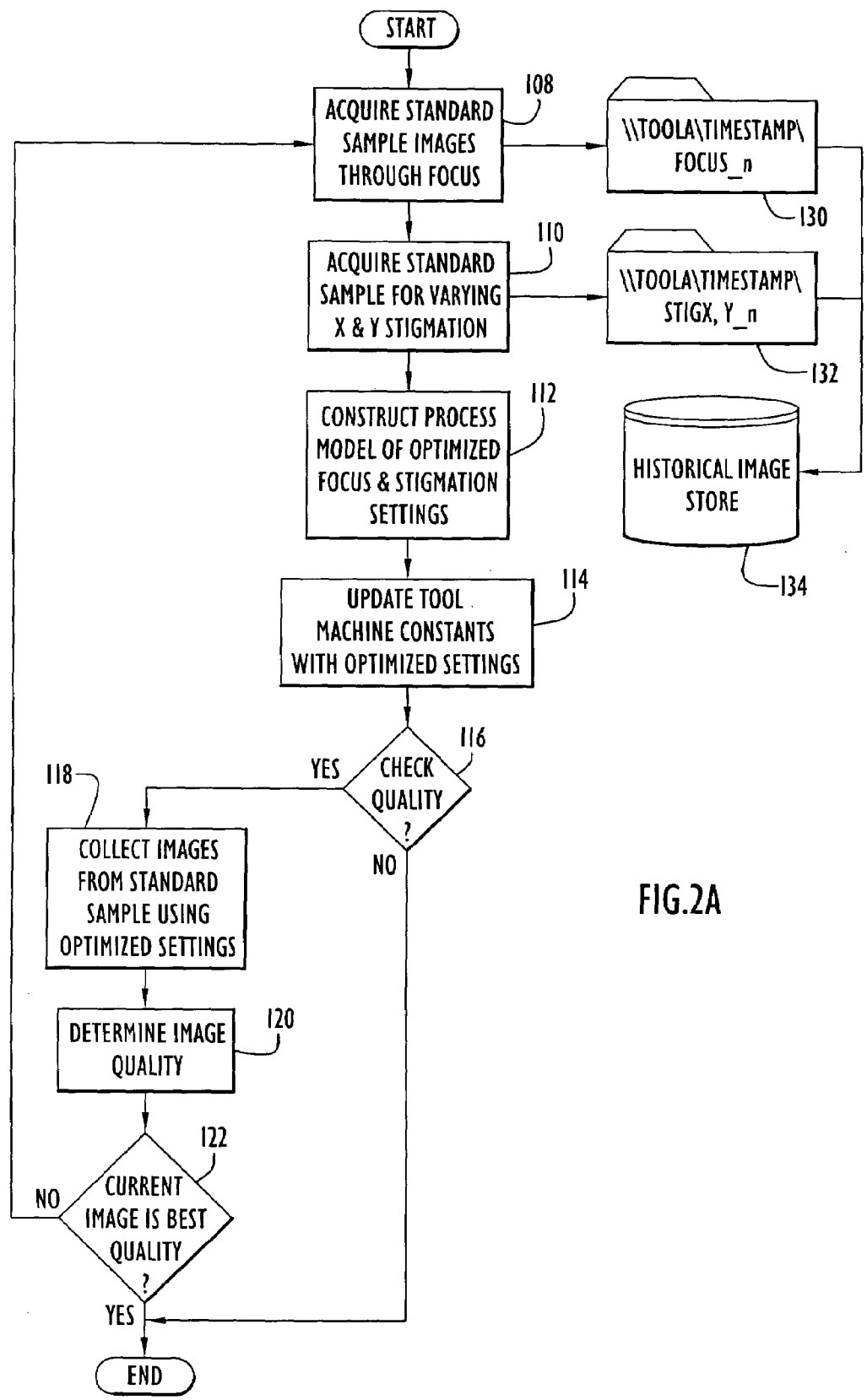
FIG. 2A is procedural flow chart illustrating the manner in which optimal beam parameters for an electron microscope are determined according to the present invention.
Figure 3:
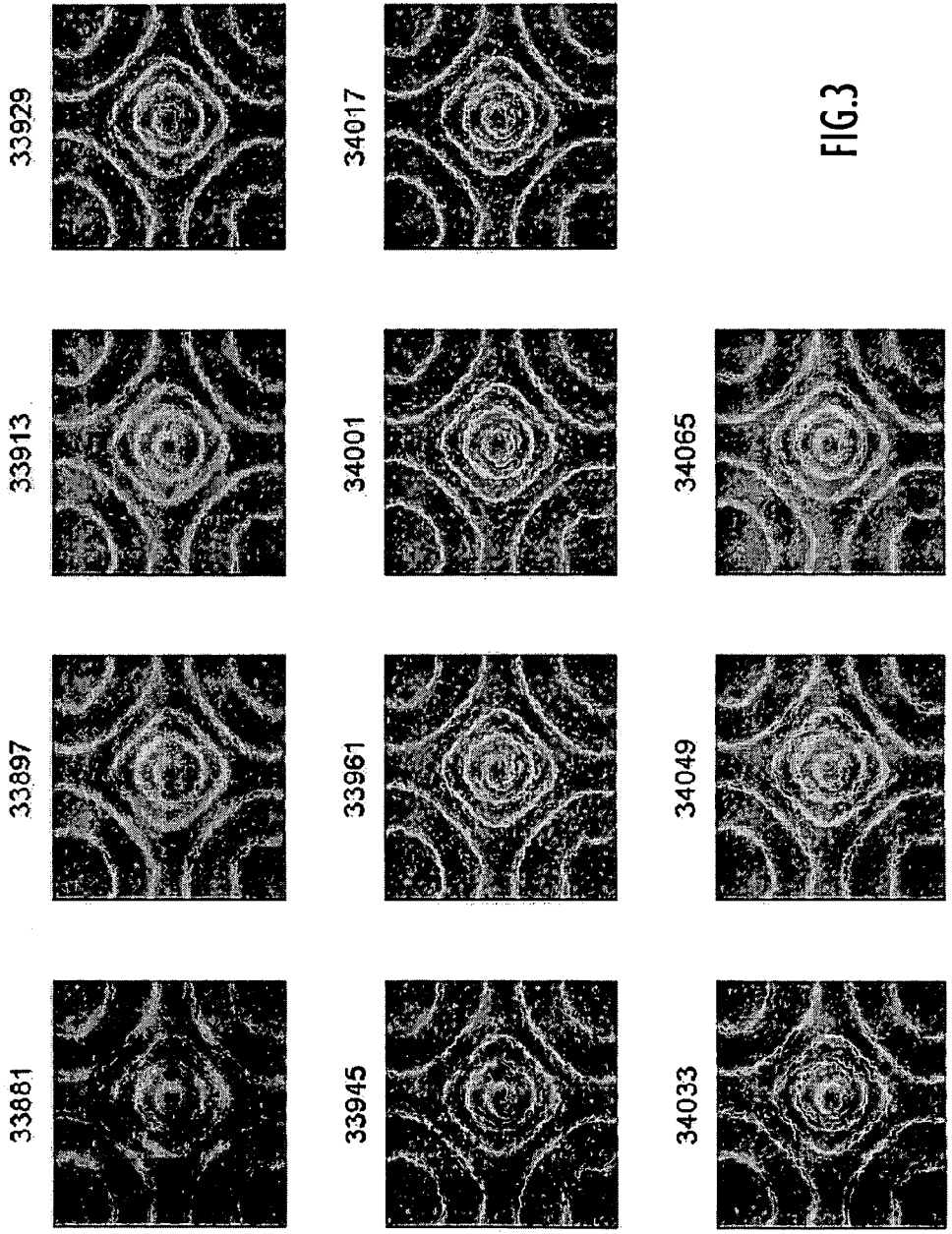
FIG. 3 are schematic illustrations of images of an exemplary sample acquired with varying focus parameter settings.
Figure 8:
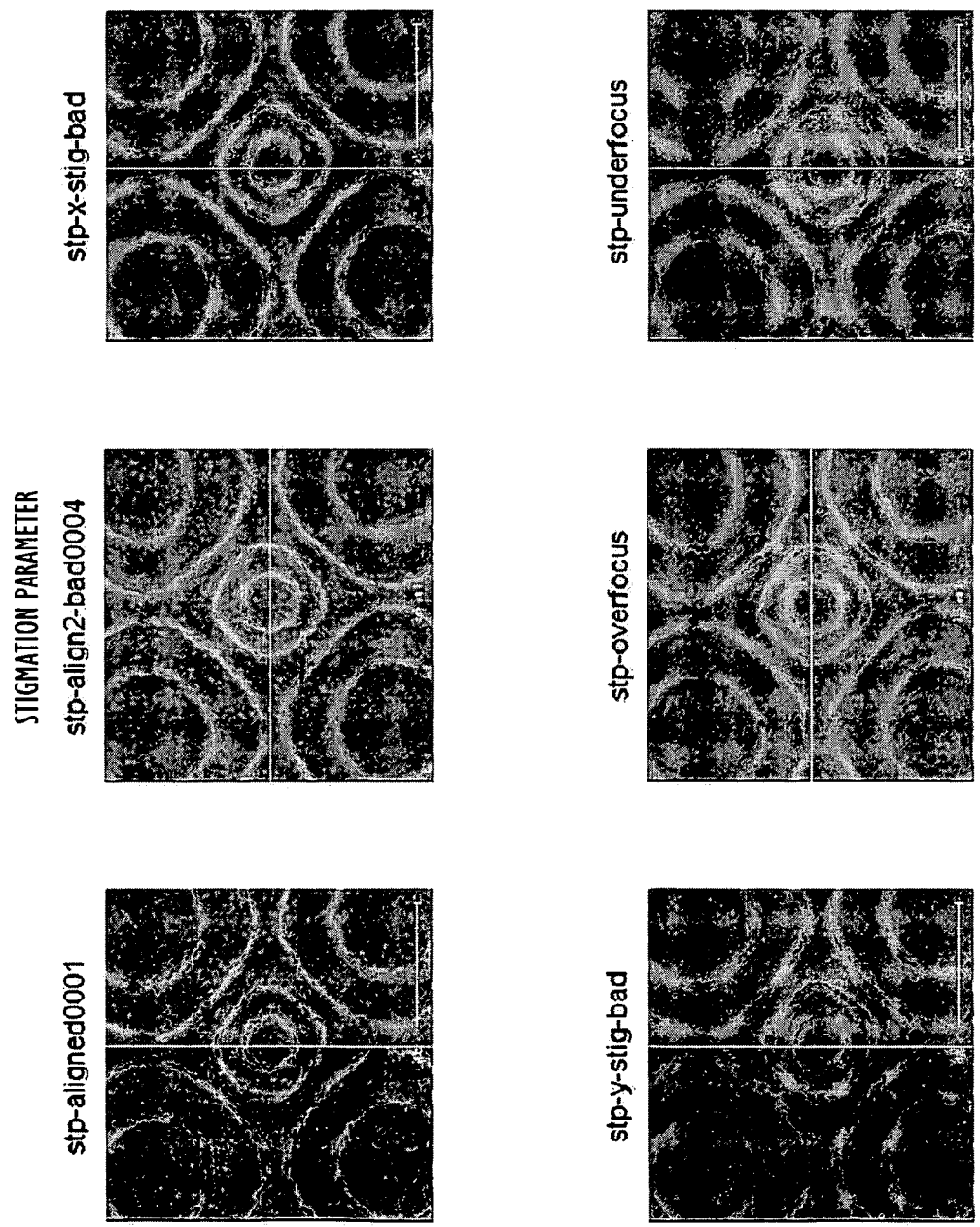
FIG. 8 are schematic illustrations of images of an exemplary sample acquired with varying stigmation parameter settings.

The manner in which optimal microscope beam parameters are determined according to the present invention is illustrated in FIG. 2A. Initially, the microscope controller and/or the computer system may include the monitoring module to monitor and determine optimal beam parameters according to the present invention as described below. Specifically, the microscope acquires images of sample 20 (FIG. 1B) with varying focus parameter settings at step 108. The beam delivery control functions (e.g., focus) are driven through a desired range to acquire the images. For example, a plurality of images of the sample may be acquired each with a different focus actuator setting (e.g., focus is varied and the focus actuator parameter for each analysis point is recorded as viewed in FIG. 3). The focus actuator parameter basically controls the configuration of the microscope lenses (e.g., magnetic lens 14, condenser lens 25, etc.) and the position of stage 22. Each captured image is stored in a folder or file 130 and transferred to historical image store 134 for storage. The microscope further acquires images of sample 20 with varying settings for other beam delivery control functions (e.g., stigmation parameter settings) at step 110. For example, a plurality of images of the sample may be acquired each with a different stigmation parameter setting (e.g., parameters providing proper and improper beam alignment, improper Stigmation X and Y parameters and parameters providing underfocus and overfocus as viewed in FIG. 8). The stigmation settings basically control stigmator coils 16. Each captured image is stored in a folder or file 132 and transferred to historical image store 134 for storage.

The acquired images are analyzed for determination of optimal microscope beam parameters by constructing a process model of the optimized settings (e.g., focus and stigmation) at step 112. This is further described with reference to FIG. 2B. In particular, once the images are captured, image analysis may be initiated for determining the optimal beam parameters at step 140. For example, machine manager 52 (FIG. 1B) may monitor operation of electron microscope 10 and invoke or launch the monitor module of microscope controller 48 and/or computer system 46 to commence determination of the optimal beam parameters. The images are subsequently retrieved from image store 134 and sorted based on the focus, stigmation or other settings at step 142.

Figure 4:
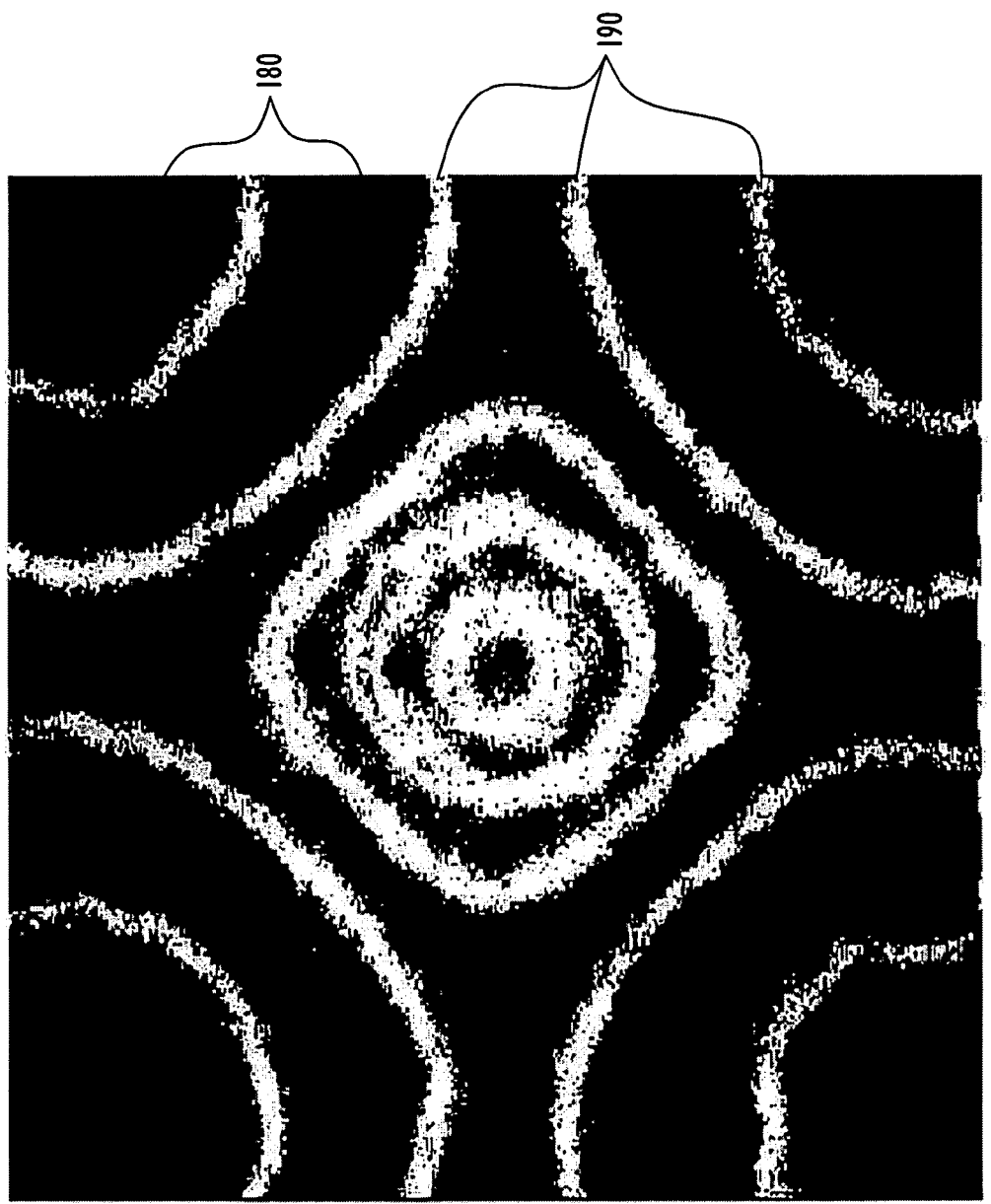
FIG. 4 is a schematic illustration of an intensity pattern of an exemplary sample scanned by an electron microscope.

An image quality value is subsequently determined as a function of the microscope focus setting at step 144. In particular, this is accomplished by identifying differentiating elements of the sample for analysis. For example, edge acuity of the sample may be in a particular region of interest for determination of an optimal beam parameter for focus. An exemplary sample pattern or image acquired by an electron microscope is illustrated in FIG. 4. In this example, the regions of interest include light regions 190 indicating edge acuity, while dark regions 180 are outside the region of interest.

Figure 5:
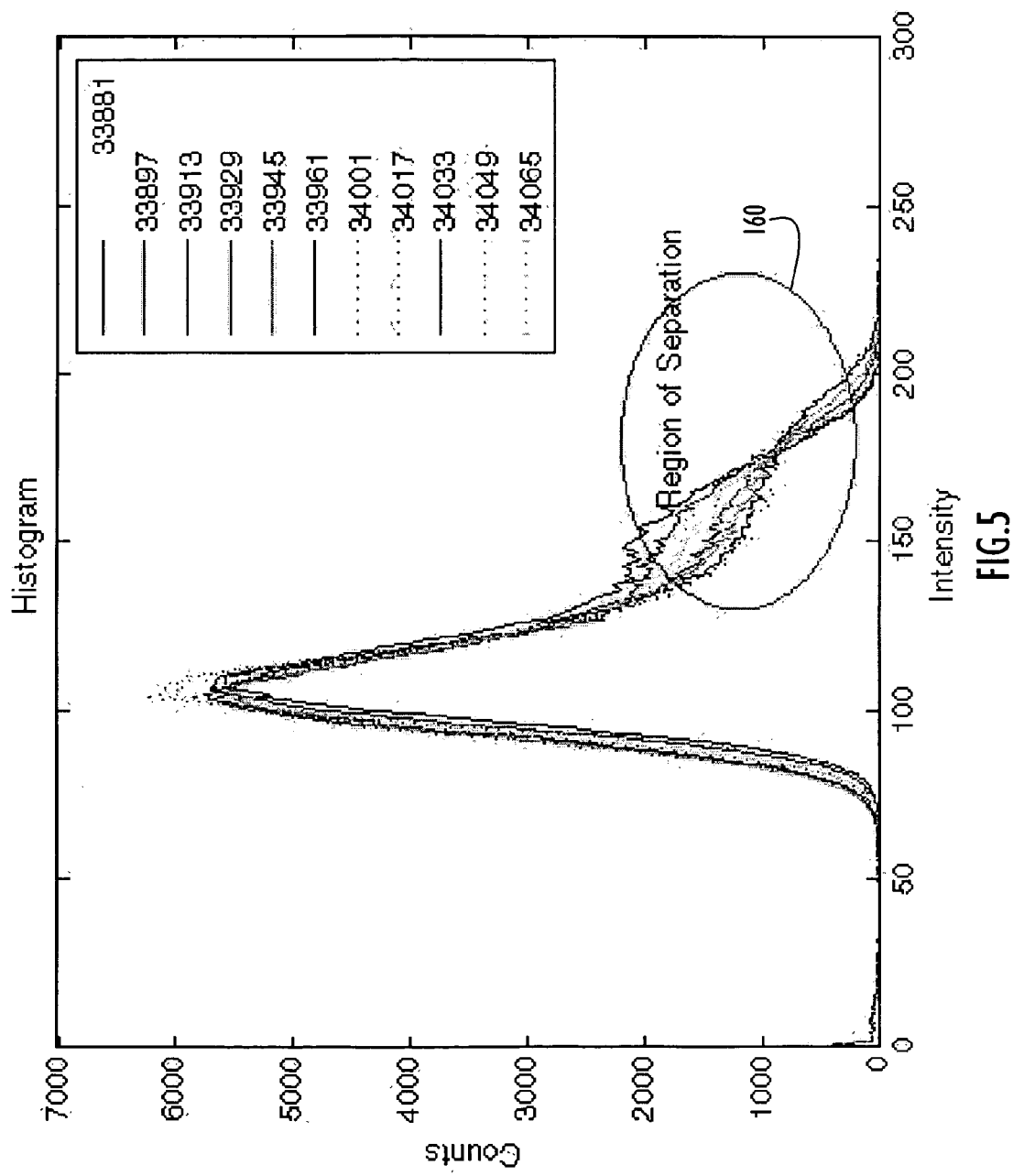
FIG. 5 is a graphical illustration of the relationship between a quantity of pixels of an exemplary scanned image and the corresponding intensity for various microscope focus parameter settings.

The retrieved images associated with the varying focus parameters are analyzed to identify a differentiating characteristic. In particular, the intensity of each image pixel is determined, where exemplary resulting data are graphically illustrated in the form of a histogram as illustrated in FIG. 5. The histogram includes a Y-axis representing a quantity of image pixels and an X-axis representing pixel intensity. The histogram basically includes a plot corresponding to each image produced from an associated focus parameter setting. The plots each indicate the amount of pixels at each intensity for an image or, in other words, the distribution of the pixel intensity across the image. The plots associated with the various focus parameter settings are substantially similar, except for a certain region 160 (e.g., an intensity in the range of 130-210 as viewed in FIG. 5), where the intensity histograms separate and the slope deviates for each of the plots. Thus, the slope is identified as the differentiating characteristic. Since the region of separation includes an intensity range corresponding to a light region 190 (FIG. 4), the region of separation excludes dark regions 180 (e.g., since the dark regions are associated with minimal intensity values) and is within the region of interest described above (e.g., light region 190) for FIG. 4. The plots may indicate one or more regions of separation, where each region may be processed in the manner described below to determine an optimal parameter setting.

Figure 6:
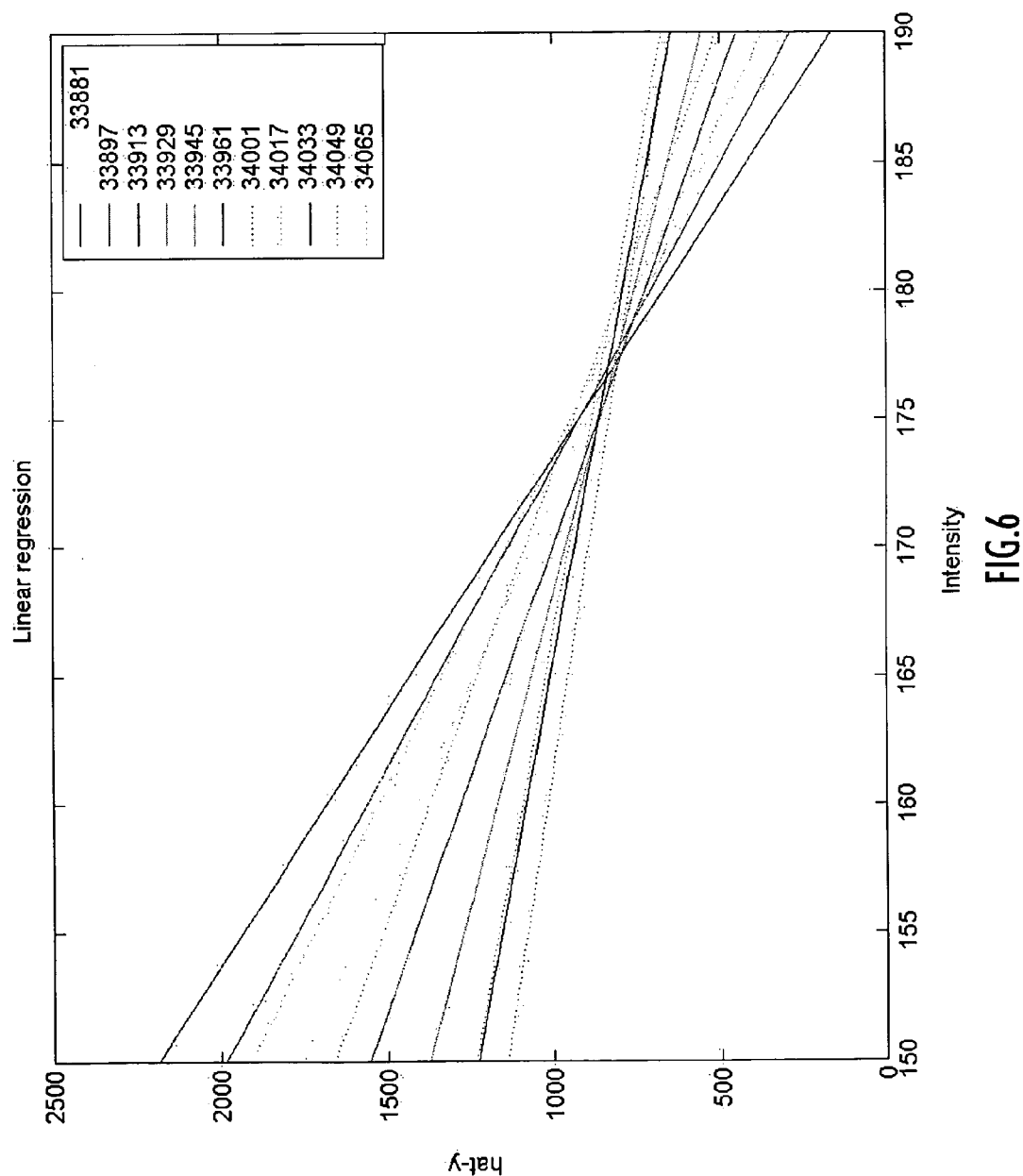
FIG. 6 is a particular portion of the graph of FIG. 5 corresponding to a region of separation between the various microscope focus parameter settings.

Once the differentiating characteristic is determined, a characteristic of the plots is identified in the region of separation that may be modeled to predict an optimal state for the parameter. Since the histogram is virtually linear for the exemplary focus parameter settings in a certain region of interest within the separation region (e.g., intensities in the range of 160-190) as illustrated in FIG. 6, conventional linear regression techniques (e.g., least squares, etc.) are utilized within this region of interest for the various focus setting plots to determine their slopes. Basically, the linear regression techniques produce a line equation (e.g., in the form of y =mx +b, where y is a resulting Y-axis coordinate, x is an X-axis coordinate, m is the slope and b is the Y-axis intercept or coordinate with respect to a zero X-axis coordinate) for each of the various plots in the region of interest, thereby indicating the slopes of those plots. The correlation coefficients for the plots (e.g., utilized to generate the resulting line equations) are generally close to one (e.g., approximately 0.95-0.99), thereby enabling the linear regression techniques to provide close approximations (e.g., line equations and corresponding slope values) for those plots.

The resulting slope for each of the plots represents a brightness indication (e.g., change in pixel count with respect to pixel intensity). Since greater brightness provides enhanced image quality, it is desirable to determine the focus setting attaining maximum brightness (e.g., a high pixel intensity and high pixel count) within the region of interest based on the slope values for the plots.

Basically, brightness of an image is based on a pixel intensity and the quantity of pixels at that intensity. The greater the quantity of pixels within the region of interest at the greatest pixel intensity, the greater the brightness and enhancement of image quality. Initially, the slope for the plots in the region of interest is negative (e.g., a decreasing pixel count or Y-axis values with respect to increasing pixel intensity or X-axis values) as viewed in FIG. 6 due to the physical and material characteristics of the exemplary sample employed. Greater brightness and image quality are indicated by a decrease in pixel count at lower intensities and an increased pixel count at higher intensities. This relates to enhanced contrast. In the exemplary case, greater brightness is achieved by a low slope magnitude (e.g., absolute value of the slope derived from the change in the Y-axis values divided by the change in X-axis values). The lower the slope magnitude in the region of interest, the greater the brightness and image quality. Since brightness provides an indication of image quality as described above, the resulting slope for each of the plots may serve as the image quality value for the corresponding image, thereby providing a quantifiable indication of the quality of that image.

Figure 2B:
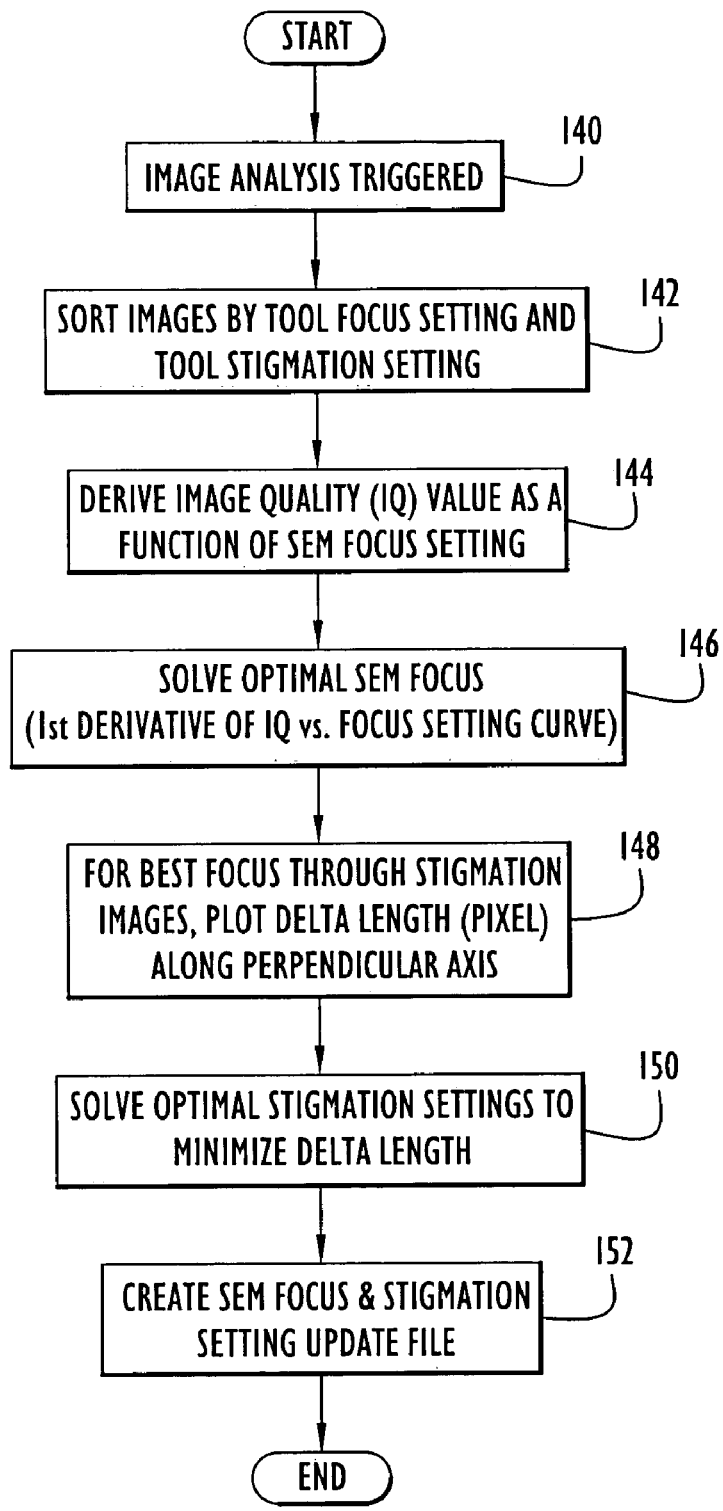
FIG. 2B is a procedural flow chart illustrating the manner in which optimal beam parameters for an electron microscope are determined based on image processing according to the present invention.
Figure 7:
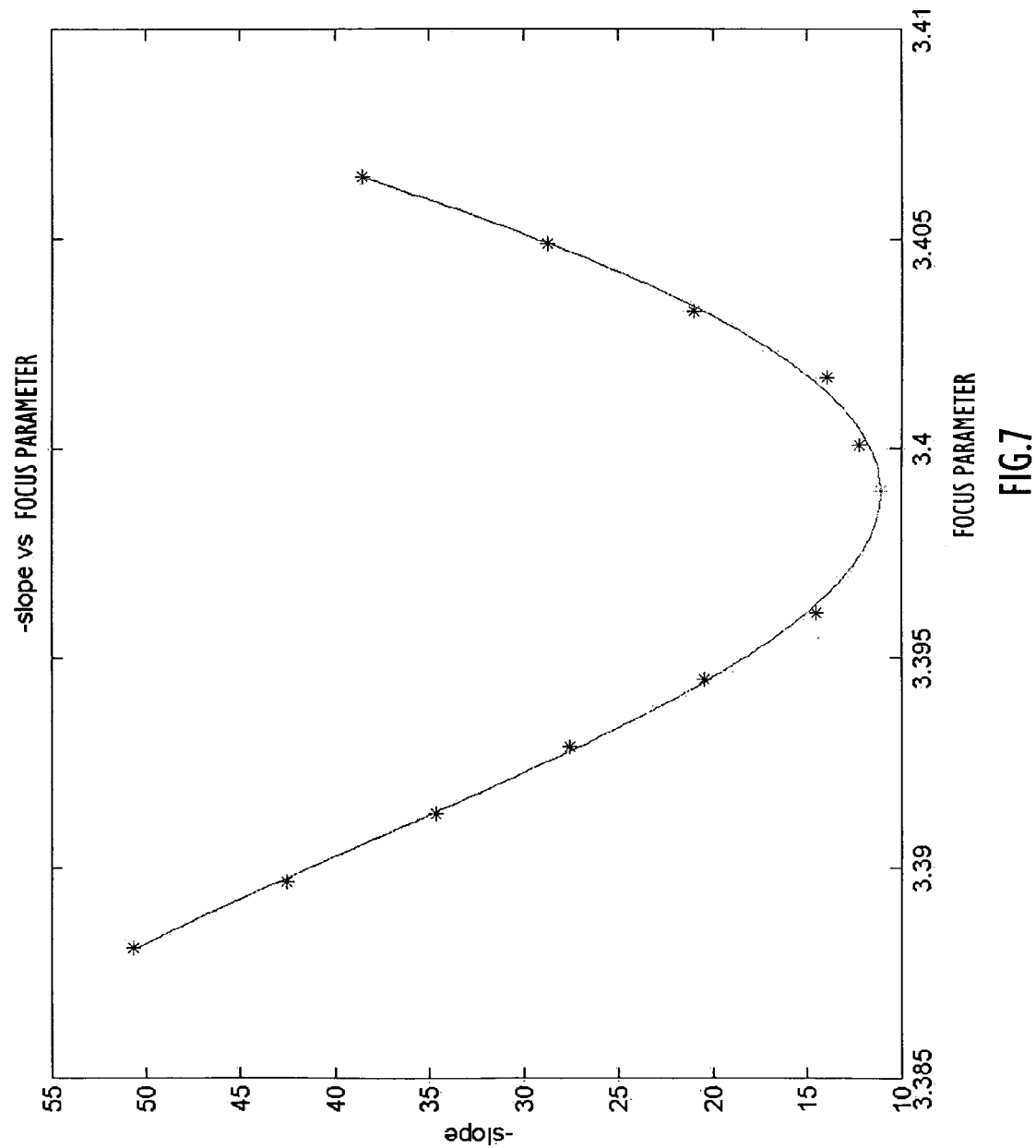
FIG. 7 is a graphical illustration of the relationship between slope in the region of separation of FIG. 6 and the focus parameter settings with identification of the optimal setting for the exemplary application.

A model is developed to predict the optimal focus parameter at step 146 (FIG. 2B). Since a lower slope magnitude in the region of interest provides greater brightness and enhanced image quality as described above, minimization of the slope magnitude of the intensity histogram data in the region of separation determines the optimal focus parameter setting providing the best image quality. The slope values for each of the exemplary focus setting plots are graphically illustrated with respect to the focus parameter settings in FIG. 7, where the Y-axis represents negative slope values and the X-axis represents the focus parameter values. A characteristic curve is generated for the resulting slope values of each focus setting plot in the separation region. The characteristic curve is typically generated by utilizing conventional non-linear regression or curve fitting techniques and generally produces an equation (e.g., second or greater order polynomial) specifying the generated curve. The point on the fitting curve with the lowest slope magnitude identifies the optimal focus parameter setting (e.g., as viewed in FIG. 7). This may be produced by determining the value of the variable for the first derivative of the equation for the fitted curve producing a zero resulting value. Periodic data may be collected and used to determine slopes and the optimal focus set point in substantially the same manner described above.

Figure 9:
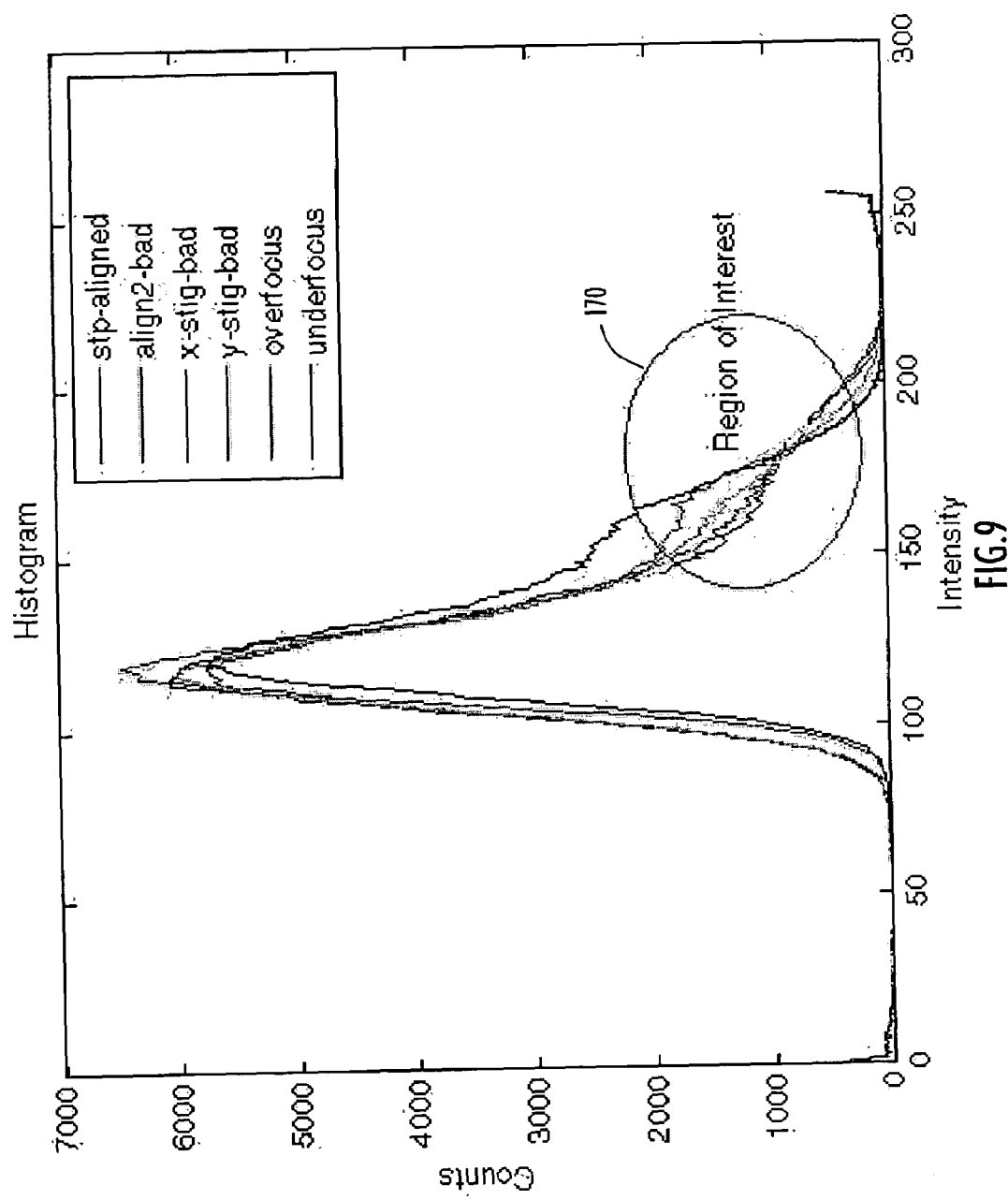
FIG. 9 is a graphical illustration of the relationship between a quantity of pixels of an exemplary scanned image and the corresponding intensity for various microscope stigmation parameter settings.

A similar analysis is performed with respect to the stigmation images to determine optimal stigmation parameter settings at steps 148 and 150 (FIG. 2B). In particular, the retrieved images associated with the varying stigmation parameter settings are analyzed at step 148 to identify a differentiating characteristic. In particular, the intensity of each image pixel is determined, where exemplary resulting data are graphically illustrated in the form of a histogram as illustrated in FIG. 9. The histogram includes a Y-axis representing a quantity of image pixels and an X-axis representing pixel intensity. The histogram basically includes a plot corresponding to each image produced from an associated stigmation parameter setting. The plots each indicate the amount of pixels at each intensity for an image or, in other words, the distribution of the pixel intensity across the image. The plots associated with the various stigmation parameter settings are substantially similar, except for a certain region 170 (e.g., an intensity in the range of 130-220 as viewed in FIG. 9), where the intensity histograms separate and the slope deviates for each of the plots. Thus, the slope is identified as the differentiating characteristic. Since the region of separation includes an intensity range corresponding to a light region 190 (FIG. 4), the region of separation excludes dark regions 180 (e.g., since the dark regions are associated with minimal intensity values) and is within the region of interest described above (e.g., light region 190) for FIG. 4. The plots may indicate one or more regions of separation, where each region may be processed in the manner described below to determine an optimal parameter setting.

Once the differentiating characteristic is determined, a characteristic of the plots is identified in the region of separation that may be modeled to predict an optimal state for the parameter. Since the histogram is virtually linear for the exemplary stigmation parameter settings in a certain region of interest within the separation region (e.g., intensities in the range of 160-190) as viewed in FIG. 9, conventional linear regression techniques (e.g., least squares, etc.) are utilized within this region of interest for the various stigmation setting plots to determine their slopes. Basically, the linear regression techniques produce a line equation (e.g., in the form of $y=mx+b$, where y is a resulting Y-axis coordinate, x is an X-axis coordinate, m is the slope and b is the Y-axis intercept or coordinate with respect to a zero X-axis coordinate) for each of the various plots in the region of interest, thereby indicating the slopes of those plots. The correlation coefficients for the plots (e.g., utilized to generate the resulting line equations) are generally close to one (e.g., approximately 0.95-0.99), thereby enabling the linear regression techniques to provide close approximations (e.g., line equations and corresponding slope values) for those plots.

The resulting slope for each of the plots represents a brightness indication (e.g., change in pixel count with respect to pixel intensity). Since greater brightness provides enhanced image quality as described above, it is desirable to determine the stigmation setting attaining maximum brightness (e.g., a high pixel intensity and high pixel count) within the region of interest based on the slope values for the plots.

Basically, brightness of an image is based on a pixel intensity and the quantity of pixels at that intensity as described above. The greater the quantity of pixels within the region of interest at the greatest pixel intensity, the greater the brightness and enhancement of image quality. Initially, the slope for the plots in the region of interest is negative (e.g., a decreasing pixel count or Y-axis values with respect to increasing pixel intensity or X-axis values) as viewed in FIG. 9 due to the physical and material characteristics of the exemplary sample employed. Greater brightness and image quality are indicated by a decrease in pixel count at lower intensities and an increased pixel count at higher intensities. This relates to enhanced contrast. In the exemplary case, greater brightness is achieved by a low slope magnitude (e.g., absolute value of the slope derived from the change in the Y-axis values divided by the change in X-axis values). The lower the slope magnitude in the region of interest, the greater the brightness and image quality. Since brightness provides an indication of image quality as described above, the resulting slope for each of the plots may serve as an image quality value for the corresponding image, thereby providing a quantifiable indication of the quality of that image.

A model is developed to predict the optimal stigmation parameter at step 150 (FIG. 2B). Since a lower slope magnitude in the region of interest provides greater brightness and enhanced image quality as described above, minimization of the slope magnitude of the intensity histogram data in the region of separation determines the optimal stigmation parameter setting providing the best image quality. The negative slope values for each stigmation setting plot may be graphically illustrated with respect to the stigmation parameter settings in a manner similar to that described above for FIG. 7. A characteristic curve is generated for the resulting slope values of each stigmation setting plot in the separation region. The characteristic curve is typically generated by utilizing conventional non-linear regression or curve fitting techniques and generally produces an equation (e.g., second or greater order polynomial) specifying the generated curve. The point on the fitting curve with the lowest slope magnitude identifies the optimal stigmation parameter setting in a manner similar to that described above for FIG. 7. This may be produced by determining the value of the variable for the first derivative of the equation for the fitted curve producing a zero resulting value. Periodic data may be collected and used to determine slopes and the optimal stigmation set point in substantially the same manner described above. Optimal settings for various beam delivery parameters may be determined in substantially the same manner described above. Further, other models or functions may be utilized in the region of separation. For example, the area bound by or beneath a region of interest of a particular image characteristic curve may be analyzed by an integration process to determine differentiating image characteristics. Once the optimal parameter settings are determined, the settings are stored at step 152 in an update file 50 (FIG. 1B).

Since beam parameters (e.g., defocus, astigmatism and poor alignment of the microscope) or condition of hardware components each affect a common parameter (e.g., the slope in the region of separation) as described above, these characteristics may be detected based on that common parameter. For example, if optimal microscope beam settings are employed and the image quality remains unsatisfactory, this may indicate problems with hardware components of the microscope. Thus, optimal microscope settings may be maintained by monitoring the slope in the region of separation.

Referring back to FIG. 2A, once the optimal beam parameters are determined and stored in file 50, the microscope machine constants are updated with the optimized settings at step 114. Specifically, file 50 is transferred to beam setting folder 54 within microscope 10. Beam controller 30 subsequently controls the beam of microscope 10 in accordance with the updated beam parameters. The image produced by the updated beam parameters may be examined for image quality. If the image quality inspection is to be bypassed as determined at step 116, the monitoring process is terminated. However, when image quality is to be inspected, an image is collected from sample 20 using the optimized settings at step 118. The quality of the collected image is determined at step 120 by producing an image quality value for the image (e.g., representing the slope in the region of separation) in substantially the same manner described above. The image quality value is compared to one or more image quality values of images produced from prior settings. If the difference between the image quality value of the current image and the prior image quality values exceeds a user-defined threshold (e.g., indicating unsatisfactory image quality) as determined at step 122, the process to determine optimal beam parameters is repeated by initially collecting images with various focus and stigmation parameters at steps 108, 110 as described above. The current image is considered to include sufficient quality in response to being within the user-defined threshold or tolerance of images produced from prior optimal settings. When the current image includes sufficient quality, the monitoring process is terminated.

Figure 10:
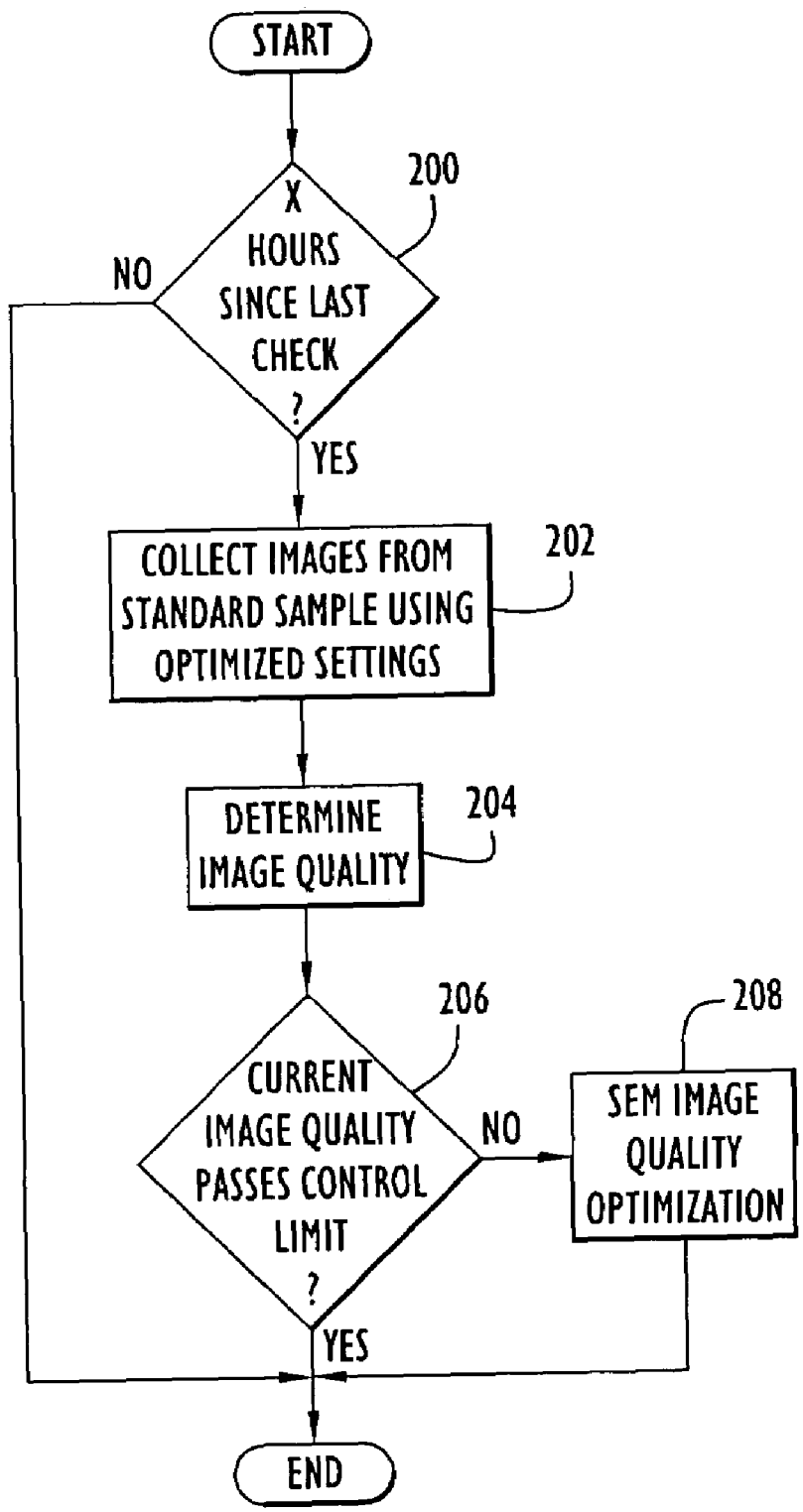
FIG. 10 is a procedural flow chart illustrating the manner in which a scanning electron microscope is monitored with beam parameter adjustment according to the present invention.

Operation of the present invention to monitor and adjust beam parameter settings of microscope 10 is described with reference to FIGS. 1B and 10. Initially, the microscope controller and/or the computer system may include the monitoring module to monitor and determine optimal beam parameters according to the present invention as described below. Specifically, the elapsed time since occurrence of a prior image quality inspection is determined. If the elapsed time is less than a predetermined amount of time (e.g., quantity of hours, minutes, seconds, etc.) as determined at step 200, the monitoring process is terminated and re-evaluation of the microscope beam parameters commences after expiration of the predetermined interval.

However, when the elapsed time is greater than the predetermined amount of time, the microscope collects an image from sample 20 utilizing current optimized beam parameters at step 202, where the quality of the collected image is determined at step 204. The quality of the collected image is determined by producing an image quality value for the image (e.g., representing the slope in the region of separation) in substantially the same manner described above. The image quality value is compared to one or more image quality values of images produced from prior settings. If the difference between the image quality value of the current image and the prior image quality values exceeds a user-defined threshold (e.g., indicating unsatisfactory image quality) as determined at step 206, optimal beam parameters are determined for the microscope at step 208 in substantially the same manner described above for FIGS. 2A and 2B. Otherwise, the monitoring process is terminated and re-evaluation of the microscope beam parameters commences after expiration of the predetermined interval.

It will be appreciated that the embodiments described above and illustrated in the drawings represent only a few of the many ways of implementing a method and apparatus for automated beam optimization in a scanning electron microscope.

The present invention maybe applied to any type of scanning microscope (e.g., SEM, CDSEM, SIM, microscopes utilizing any charged ions or other particle beams, etc.). The microscope may be utilized in any suitable facility in any desired arrangements (e.g., networked, direct or indirect communication, etc.). The microscope arrangement may include any quantity of components (e.g., microscopes, machine managers, computer systems, networks, image stores, etc.) that may be in communication with or coupled to each other in any suitable fashion (e.g., wired, wireless, over a network (e.g., WAN, LAN, Internet, etc.), directly or indirectly coupled, local or remote from each other, etc.) via any communications medium and may utilize any suitable communication protocol or standard.

The microscope may include any quantity of any conventional or other components (e.g., electron or other particle gun, lenses, dispersion device, stigmator coils, reflected and discharged electron detector units, stage, etc.) arranged within or external of the microscope in any suitable fashion. The image stores, files and folders may be of any quantity and may be implemented by any conventional or other storage devices (e.g., memory, database, data structures, etc.). The image formation unit may be implemented by any conventional or other microprocessor, controller, processing system and/or circuitry (e.g., any combination of hardware and/or software modules) to process collected particles and form and/or process any desired images. The image formation unit may be disposed within or external of the microscope and communicate with the microscope in any fashion (e.g., directly or indirectly coupled, communicate via a network, etc.).

The microscope controller may be implemented by any conventional or other microprocessor, controller, processing system and/or circuitry (e.g., any combination of hardware and/or software modules) to control microscope operation. The microscope controller may be disposed within or external of the microscope and communicate with the microscope in any fashion (e.g., directly or indirectly coupled, communicate via a network, etc.).

The computer system of the present invention may be implemented by any quantity of any personal or other type of computer or processing system (e.g., IBM-compatible, Apple, Macintosh, laptop, palm pilot, microprocessor, etc.). The computer system may include any commercially available operating system (e.g., Windows, OS/2, Unix, Linux, etc.), any commercially available and/or custom software (e.g., communications software, microscope monitoring software, etc.) and any types of input devices (e.g., keyboard, mouse, microphone, voice recognition, etc.). It is to be understood that the software of the present invention may be implemented by any conventional or custom software (e.g., conventional or custom image processing software, etc.) in any desired computer language, and could be developed by one of ordinary skill in the computer and/or programming arts based on the functional description contained herein and the flow charts illustrated in the drawings. Further, any references herein of software performing various functions generally refer to computer systems or processors performing those functions under software control. The computer system may alternatively be implemented by hardware or other processing circuitry. The various functions of the present invention may be distributed in any manner among any quantity (e.g., one or more) of hardware and/or software modules or units, computer or processing systems or circuitry, where the computer or processing systems may be disposed locally or remotely of each other and communicate via any suitable communications medium (e.g., LAN, WAN, Intranet, Internet, hardwire, modem connection, wireless, etc.). The software and/or algorithms described above and illustrated in the flow charts and diagrams maybe modified in any manner that accomplishes the functions described herein.

The present invention software (e.g., monitoring module) may be available on a recordable medium (e.g., magnetic or optical mediums, magneto-optic mediums, floppy diskettes, CD-ROM, DVD, memory devices, etc.) for use on stand-alone systems or systems connected by a network or other communications medium, and/or may be downloaded (e.g., in the form of carrier waves, packets, etc.) to systems via a network or other communications medium.

The present invention may utilize any quantity of images of a sample to determine the optimal beam parameter setting and/or image quality value. The images may cover any desired variation range for a particular parameter. The sample may be of any quantity, may be of any shape or size, and may include any desired features. The sample may include a specific configuration for a desired application or parameter setting. The sample may be disposed at any desired location on or off the stage to acquire images. The sample may be in the form of a product specimen (e.g., semi-conductor device, etc.). The present invention may utilize any quantity of images for the image quality comparison, where the image quality values for current and prior images may be combined in any suitable fashion (e.g., averaged, weighted, summed, etc.). The user threshold may be set to any suitable values depending upon the desired image quality. The comparison of image quality values may utilize any mathematical or statistical operations to determine image quality compliance (e.g., a comparison, statistical variance or deviation, etc.).

The present invention may analyze any suitable characteristics (e.g., intensity, pixel counts, power, etc.) and utilize any differentiating characteristic between settings in any desired region. The region of separation may be of any shape or size and be located within any desired range. The present invention may utilize any suitable modeling or approximation techniques to determine best fit lines and/or curves (e.g., linear or non-linear regression, curve fitting, least squares, integration, etc.). The models may approximate the data within any suitable tolerances. The present invention may identify any quantity of separation regions and utilize any suitable techniques to combine and/or select resulting slope values (e.g., lowest slope, average, weighting, sum, etc.).

The parameter determination may be triggered in any suitable fashion (e.g., the machine manager may monitor the microscope to initiate the determination, the computer system or controller may periodically retrieve images based on a periodic acquisition of sample images or poll the image store to determine the presence of sample images, manually trigger determination, etc.). The quality inspection and/or parameter determination may be initiated in response to any suitable conditions (e.g., within any desired time interval (e.g., within any quantity of hours, minutes, etc.), subsequent any quantity of images generated by the microscope (e.g., every Nth scan performed by the microscope), subsequent any quantity of quality inspections, etc.).

The present invention technique may be performed automatically, where parameters are determined and applied to the microscope. Alternatively, any portions of the technique may be determined manually (e.g., scanning of images, manual determination of parameters, manual application of the parameters, etc.). For example, the computer system may provide the optimal settings to a technician that manually applies the settings to the microscope. The microscope controller may perform any desired processing (e.g., monitoring and parameter adjustment, image formation and processing, etc.). The present invention technique may be distributed among the computer system, microscope controller or other processing device in any desired fashion, where these devices may be local or remote from each other. The computer system and microcontroller may be in communication with and/or control the microscope to perform any desired portions of the present invention (e.g., scan the sample and generate the images, transfer images to the image store, etc.).

The present invention is not limited to the applications described above, but may be used with any microscopes scanning any desired objects to provide monitoring and optimal parameter determination and adjustment as described above. The present invention may be utilized to monitor and determine optimal settings for any desired microscope parameters in the manner described above. The image quality value may be derived from any desired parameter or combination of parameters (e.g., focus, stigmation, etc.). The present invention may utilize maximum, minimum or other slope values (or magnitudes or absolute values of the slopes) to determine resulting parameter settings depending upon the location of the region of separation (e.g., depending upon negative or positive slopes) and/or the characteristics being analyzed (e.g., intensity, etc.).

From the foregoing description, it will be appreciated that the invention makes available a novel a method and apparatus for automated beam optimization in a scanning electron microscope, wherein optimal beam parameters for a scanning electron microscope are determined and automatically applied to adjust the microscope beam for enhanced operation.

Having described preferred embodiments of a new and improved a method and apparatus for automated beam optimization in a scanning electron microscope, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus to monitor and determine parameter settings for beam control in a scanning microscope comprising:
a processor to process images of a sample each generated by said microscope with a varying setting of a corresponding microscope parameter pertaining to beam control and including:
an evaluation module to evaluate information of each image associated with said microscope parameter to identify a region with differentiation between said varying parameter settings;
a model module to approximate behavior of said information in said identified region for each image associated with said microscope parameter to determine a response in that region for each of those images, wherein said response serves as an image quality value indicating quality of said associated image; and
a parameter module to determine a resulting parameter setting for said associated microscope parameter pertaining to beam control based on an optimization of said responses of said images to control said microscope beam.

2. The apparatus of claim 1, wherein said microscope parameter includes at least one of a focus parameter and a stigmation parameter.

3. The apparatus of claim 1, wherein said model module approximates said information behavior via linear regression techniques to determine said responses and said parameter module determines said resulting parameter setting via curve fitting techniques applied to said responses, wherein a lowest slope of a generated curve indicates said resulting parameter setting.

4. The apparatus of claim 1, wherein said processor further includes:

a comparison module to compare an image quality value of at least one currently scanned microscope image with at least one image quality value of prior images and initiating determination of said resulting parameter setting in response to said at least one current image quality value varying from said at least one prior image quality value in excess of a threshold.

5. The apparatus of claim 4, wherein said processor further includes:
an inspection module to ascertain at least one currently scanned image and determine said image quality value for each currently scanned image for said comparison in response to occurrence of a particular condition to monitor said microscope parameters.

6. The apparatus of claim 1, wherein said microscope includes a critical dimension scanning electron microscope.

7. The apparatus of claim 1, wherein said response includes a change of intensity in said identified region for an associated image.

8. A program product apparatus including a computer readable medium with computer program logic recorded thereon for monitoring and determining parameter settings for beam control in a scanning microscope comprising:
an evaluation module to evaluate information of each image of a sample generated by said microscope with a varying setting of a corresponding microscope parameter pertaining to beam control to identify a region with differentiation between said varying parameter settings;
a model module to approximate behavior of said information in said identified region for each image associated with said microscope parameter to determine a response in that region for each of those images, wherein said response serves as an image quality value indicating quality of said associated image; and
a parameter module to determine a resulting parameter setting for said associated microscope parameter pertaining to beam control from an optimization of said responses of said images to control said microscope beam.

9. The apparatus of claim 8, wherein said microscope parameter includes at least one of a focus parameter and a stigmation parameter.

10. The apparatus of claim 8, wherein said model module approximates said information behavior via linear regression techniques to determine said responses and said parameter module determines said resulting parameter setting via curve fitting techniques applied to said responses, wherein a lowest slope of a generated curve indicates said resulting parameter setting.

11. The apparatus of claim 8, wherein said processor further includes:
a comparison module to compare an image quality value of at least one currently scanned microscope image with at least one image quality value of prior images and initiating determination of said resulting parameter setting in response to said at least one current image quality value varying from said at least one prior image quality value in excess of a threshold.

12. The apparatus of claim 11, wherein said processor further includes:
an inspection module to ascertain at least one currently scanned image and determine said image quality value for each currently scanned image for said comparison in response to occurrence of a particular condition to monitor said microscope parameters.

13. The apparatus of claim 8, wherein said microscope includes a critical dimension scanning electron microscope.

14. The apparatus of claim 8, wherein said response includes a change of intensity in said identified region for an associated image.

15. An apparatus to monitor and determine parameter settings for beam control in a scanning microscope comprising:
processing means for processing images of a sample each generated by said microscope with a varying setting of a corresponding microscope parameter pertaining to beam control and including:
evaluation means for evaluating information of each image associated with said microscope parameter to identify a region with differentiation between said varying parameter settings;
model means for approximating behavior of said information in said identified region for each image associated with said microscope parameter to determine a response in that region for each of those images, wherein said response serves as an image quality value indicating quality of said associated image; and
parameter means for determining a resulting parameter setting for said associated microscope parameter pertaining to beam control from an optimization of said responses of said images to control said microscope beam.

16. The apparatus of claim 15, wherein said microscope parameter includes at least one of a focus parameter and a stigmation parameter.

17. The apparatus of claim 15, wherein said model means approximates said information behavior via linear regression techniques to determine said responses and said parameter means determines said resulting parameter setting via curve fitting techniques applied to said responses, wherein a lowest slope of a generated curve indicates said resulting parameter setting.

18. The apparatus of claim 15, wherein said processing means further includes:
comparison means for comparing an image quality value of at least one currently scanned microscope image with at least one image quality value of prior images and initiating determination of said resulting parameter setting in response to said at least one current image quality value varying from said at least one prior image quality value in excess of a threshold.

19. The apparatus of claim 18, wherein said processing means further includes:
inspection means for ascertaining at least one currently scanned image and determining said image quality value for each currently scanned image for said comparison in response to occurrence of a particular condition to monitor said microscope parameters.

20. The apparatus of claim 15, wherein said microscope includes a critical dimension scanning electron microscope.

21. The apparatus of claim 15, wherein said response includes a change of intensity in said identified region for an associated image.

22. A scanning microscope system monitoring and determining parameter settings for beam control comprising:
a beam unit for generating and controlling a beam to scan a sample in accordance with microscope parameters pertaining to beam control;
an image unit to generate an image of said sample based on information collected from said scan;

a processor to process images of said sample each generated with a varying setting of a corresponding microscope parameter pertaining to beam control and including:
- an evaluation module to evaluate information of each image associated with said microscope parameter to identify a region with differentiation between said varying parameter settings;
- a model module to approximate behavior of said information in said identified region for each image associated with said microscope parameter to determine a response in that region for each of those images, wherein said response serves as an image quality value indicating quality of said associated image; and
- a parameter module to determine a resulting parameter setting for said associated microscope parameter pertaining to beam control from an optimization of said responses of said images to control said microscope beam.

23. The system of claim 22, wherein said microscope parameter includes at least one of a focus parameter and a stigmation parameter.

24. The system of claim 22, wherein said model module approximates said information behavior via linear regression techniques to determine said responses and said parameter module determines said resulting parameter setting via curve fitting techniques applied to said responses, wherein a lowest slope of a generated curve indicates said resulting parameter setting.

25. The system of claim 22, wherein said processor further includes:
- a comparison module to compare an image quality value of at least one currently scanned microscope image with at least one image quality value of prior images and initiating determination of said resulting parameter setting in response to said at least one current image quality value varying from said at least one prior image quality value in excess of a threshold.

26. The system of claim 25, wherein said processor further includes:
- an inspection module to ascertain at least one currently scanned image and determine said image quality value for each currently scanned image for said comparison in response to occurrence of a particular condition to monitor said microscope parameters.

27. The system of claim 22, wherein said scanning microscope system includes a critical dimension scanning electron microscope.

28. The system of claim 22, wherein said response includes a change of intensity in said identified region for an associated image.

* * * * *